(12) United States Patent
Bratkovski et al.

(10) Patent No.: US 8,053,982 B2
(45) Date of Patent: *Nov. 8, 2011

(54) LIGHT-EMITTING DIODES WITH CARRIER EXTRACTION ELECTRODES

(75) Inventors: Alexandre Bratkovski, Mountain View, CA (US); Shih-Yuan Wang, Palo Alto, CA (US); Michael Tan, Menlo Park, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 682 days.

This patent is subject to a terminal disclaimer.

(21) Appl. No.: 12/243,117

(22) Filed: Oct. 1, 2008

(65) Prior Publication Data

US 2009/0273293 A1    Nov. 5, 2009

Related U.S. Application Data

(60) Provisional application No. 61/126,107, filed on Apr. 30, 2008.

(51) Int. Cl.
*H01J 1/62* (2006.01)
*H01L 27/15* (2006.01)

(52) U.S. Cl. ........ 313/506; 313/512; 313/494; 313/498; 257/81; 257/79; 257/99; 257/100

(58) Field of Classification Search .................. 313/492, 313/494, 498, 506, 507, 512, 141, 607, 590, 313/620; 257/72, 79, 81, 99, 100
See application file for complete search history.

(56) References Cited

U.S. PATENT DOCUMENTS

| | | | |
|---|---|---|---|
| 4,103,312 A | 7/1978 | Chang | |
| 5,225,692 A | 7/1993 | Takeuchi | |
| 6,759,694 B1 | 7/2004 | Hsu | |
| 7,173,292 B2 | 2/2007 | Phillips | |
| 2003/0151357 A1* | 8/2003 | Uemura | ........................ 313/506 |
| 2006/0220180 A1 | 10/2006 | Takahashi | |

* cited by examiner

*Primary Examiner* — Tuyet Thi Vo (57) ABSTRACT

One embodiment of the present invention relates to a light-emitting diode having one or more light-emitting layers, a pair of electrodes disposed on the light-emitting diode so that an operating voltage can be applied to generate light from the one or more light-emitting layers, and at least one external electrode in electronic communication with the one or more light-emitting layers. Applying an appropriate voltage to the at least one external electrodes at about the time the operating voltage is terminated extracts excess electrons from the one or more light-emitting layers and reduces the duration of electron-hole recombination during the time period over which the operating voltage is turned off.

20 Claims, 7 Drawing Sheets

LIGHT-EMITTING DIODES WITH CARRIER EXTRACTION ELECTRODES

CROSS-REFERENCE TO RELATED APPLICATION

The present application claims priority from provisional application Ser. No. 61/126,107, filed Apr. 30, 2008, the contents of which are incorporated herein by reference in their entirety.

TECHNICAL FIELD

Embodiments of the present invention relate to light-emitting diodes, and in particular, to light-emitting diodes with extraction electrodes that are operated to decrease emission fall off time.

BACKGROUND

On-chip and off-chip communication has emerged as a critical issue for sustaining performance growth for the demanding, data-intensive applications for which many chips are needed. Computational bandwidth scales linearly with the growing number of transistors, but the rate at which data can be communicated across a chip using top-level metal wires is increasing at a much slower pace. In addition, the rate at which data can be communicated off-chip through pins located along the chip edge is also growing more slowly than compute bandwidth, and the energy cost of on-chip and off-chip communication significantly limits the achievable bandwidth.

Optical interconnects including optical fibers or waveguides have been proposed as an alternative to wires used in on-chip and off-chip communications. For example, a single fiber optic cable can carry terabits per second of digital information encoded in different wavelengths of light called optical signals with a capacity ranging from about $4 \times 10^4$ to about $5 \times 10^4$ times greater than transmitting the same information using wires (cf. 5 GHz Pentium with 200 THz optical signal at 1.5 micron wavelength). Because of the increasing interest in transmitting data in optical signals, much interest is now being paid to small scale light sources that can be modulated to generate optical signals. The light-emitting diode ("LED") is a low cost light source that can be modulated to encode data in optical signals. Common LEDs include a depletion layer, and in some cases may include a thin undoped or intrinsic semiconductor layer, sandwiched between a p-type semiconductor layer and an n-type semiconductor layer (see e.g., S. Sze, Ch 12.3.2 of Physics of Semiconductor Devices, $2^{nd}$ Ed., Wiley, New York, 1981). Electrodes are attached to the p-type layer and the n-type layer. When no bias is applied to an LED, the depletion layer has a relatively low concentration of electrons in a corresponding conduction band and a relatively low concentration of vacant electronic states called "holes" in a corresponding valence band and substantially no light is emitted. The electrons and holes are called "carriers." In contrast, when a forward-bias operating voltage is applied across the layers, electrons are injected into the conduction band of the depletion layer, while holes are injected into the valence band of the depletion layer creating excess carriers. The electrons in the conduction band spontaneously recombine with holes in the valence band in a radiative process called "electron-hole recombination" or "recombination." When electrons and holes recombine, photons of light are emitted with a particular wavelength. As long as an appropriate operating voltage is applied in the same forward-bias direction, nonequilibrium carrier population is maintained within the depletion layer and electrons spontaneously recombine with holes, emitting light of a particular wavelength in nearly all directions. When the bias is removed, excess carriers remaining in the depletion layer can recombine or the built-in electric field of the p-n junction can sweep the excess carriers from the depletion layer, and radiative recombination stops. The radiative recombination fall-off time is determined by the excess carrier lifetime or by the time it takes the excess carriers to drift through the depletion layer. Typically, in high-quality materials, the excess carrier lifetime is long. In some cases, therefore, excess carriers continue recombining for a period of time after the voltage is removed. Thus, the emitted optical signal may not decrease substantially for a period of time after the voltage is turned off or becomes low.

A data-encoded optical signal generated by modulating an LED is ideally composed of distinguishable high and low intensities. For example, high and low operating voltage pulses corresponding to the bits "1" and "0" can be applied to an LED to encode the same information in high and low intensities of light emitted from the LED. High intensity light emitted from an LED for a period of time can represent the bit "1," and low intensity or no light emitted from the LED for a period of time can represent the bit "0." In practice, however, when the operating voltage is modulated at high speeds, such as about 50 GHz, the high and low intensities of the optical signal may be indistinguishable because the LEDs can continue to emit light between applications of the operating voltage.

Figure 1:
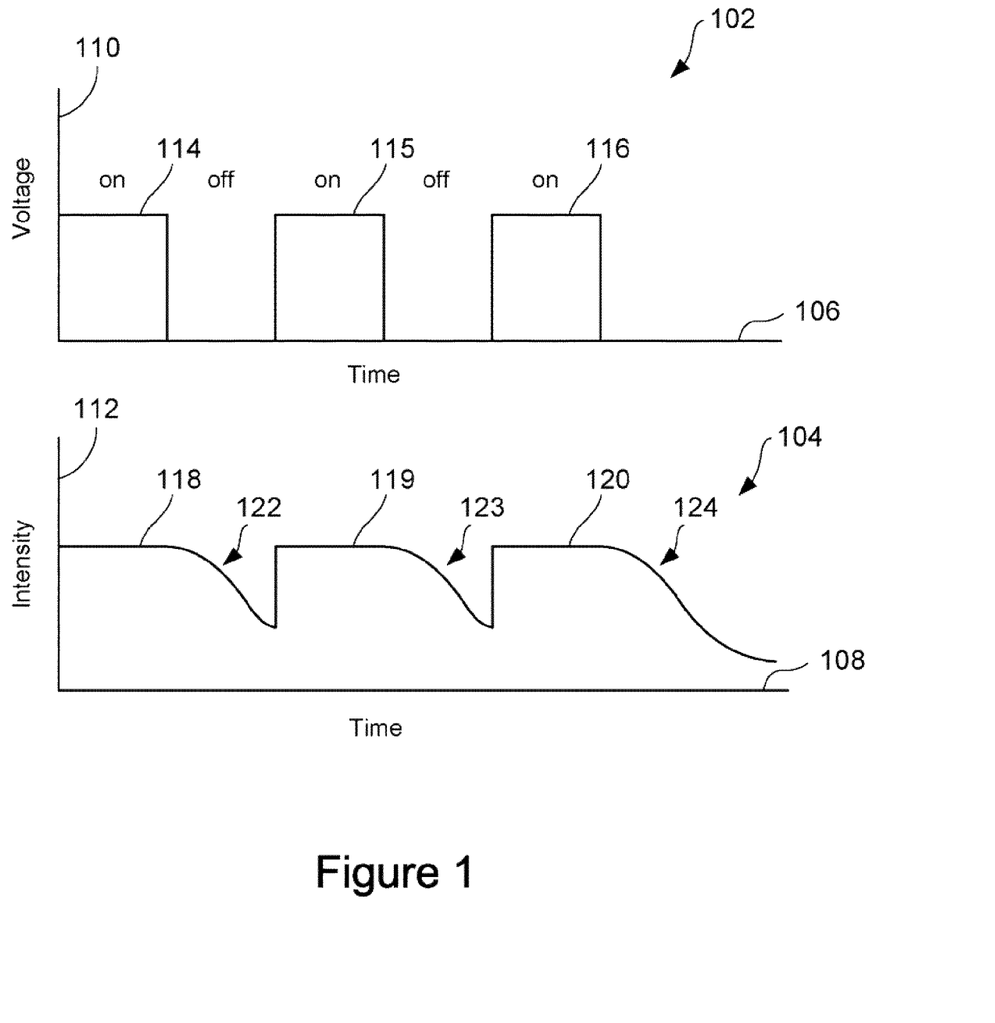
FIG. 1 shows a plot of a modulated, forward bias, operating voltage applied to a light-emitting diode versus time and a plot of intensity of an optical signal emitted from a light-emitting diode versus time.

FIG. 1 shows a first plot 102 of a modulated, forward-bias operating voltage applied to an LED versus time. FIG. 1 also shows a second plot 104 of the corresponding intensity of an optical signal emitted from the LED versus time. In plots 102 and 104, horizontal axes 106 and 108 represent time, vertical axis 110 represents the magnitude of the forward-bias operating voltage, and vertical axis 112 represents intensity of light emitted from the LED. Rectangles 114-116 represent the magnitude and duration of voltage pulses composing the modulated, forward bias, operating voltage applied to an LED, where between each pulse, the voltage is turned off. The plots 102 and 104 reveal that light is emitted from the LED with relatively constant and continuous intensities 118-120 during the time periods when the pulses 114-116 are applied. However, the plot 104 also reveals that during the time periods between pulses 114-116, the LED continues to emit light with an intensity that slowly drops off but not completely before the next pulse is applied. In particular, curved portions 122-124 represent slow relative intensity drop offs after the pulses 114-116 are turned off.

The slow relative drop off in intensity is the result of excess electrons remaining in the conduction band and holes remaining in the valence band of the depletion layer when the voltage is turned off. These electrons and holes continue to recombine in the absence of an operating voltage. In addition, because of the high modulation speed, a subsequent operating voltage pulse is applied before the excess electrons and holes have had a chance to complete recombination. Thus, high and low intensity portions of an optical signal may be indistinguishable. Accordingly, LEDs that exhibit rapid output light intensity drop off during high speed modulation are desired.

SUMMARY

One embodiment of the present invention relates to a light-emitting diode having one or more light-emitting layers, a pair of electrodes disposed on the light-emitting diode so that an operating voltage can be applied to generate light from the one or more light-emitting layers, and at least one external electrode in electronic communication with the one or more light-emitting layers. Applying an appropriate voltage to the at least one external electrodes at about the time the operating voltage is terminated extracts excess electrons from the one or more light-emitting layers and reduces the duration of electron-hole recombination during the time period between pulses composing the operating voltage.

DETAILED DESCRIPTION

Embodiments of the present invention relate to LEDs including at least one external electrode that is in electronic communication with one or more light-emitting layers (LELs) of the LEDs. Applying an appropriate voltage to the at least one external electrode at about the same time an operating voltage of the LEDs is turned off extracts excess carriers from the one or more LELs and reduces the duration of electron-hole recombination during the time period over which the operating voltage is turned off. As a result, LED embodiments of the present invention are capable of generating optical signals with distinguishable high and low intensities while operating at high modulation rates, such as modulation rates in excess of about 50 GHz.

Figure 2A:
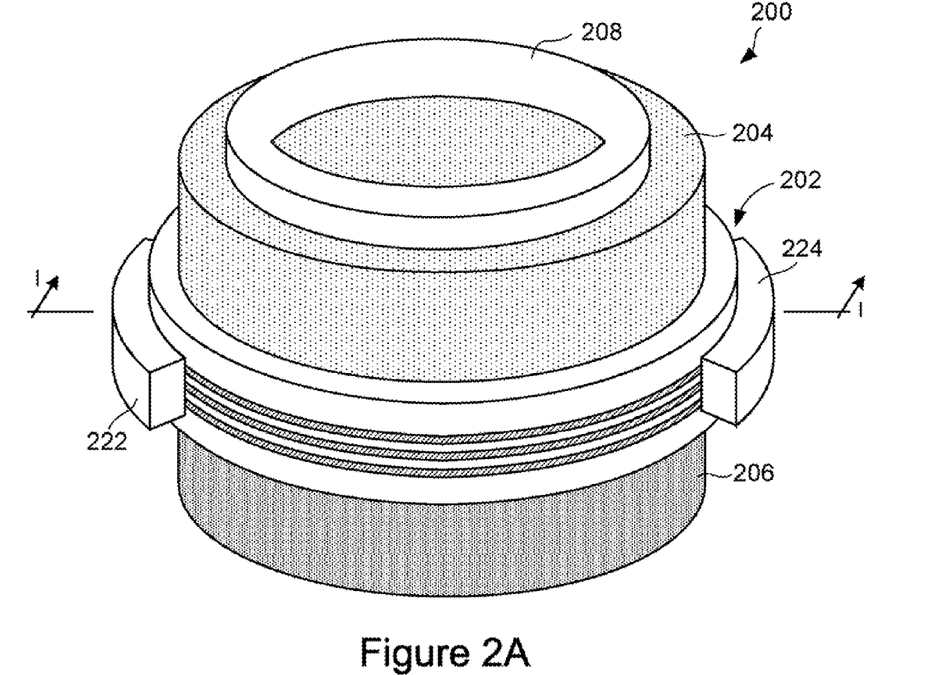
FIG. 2A shows an isometric view of a first light-emitting diode configured in accordance with embodiments of the present invention.
Figure 2B:
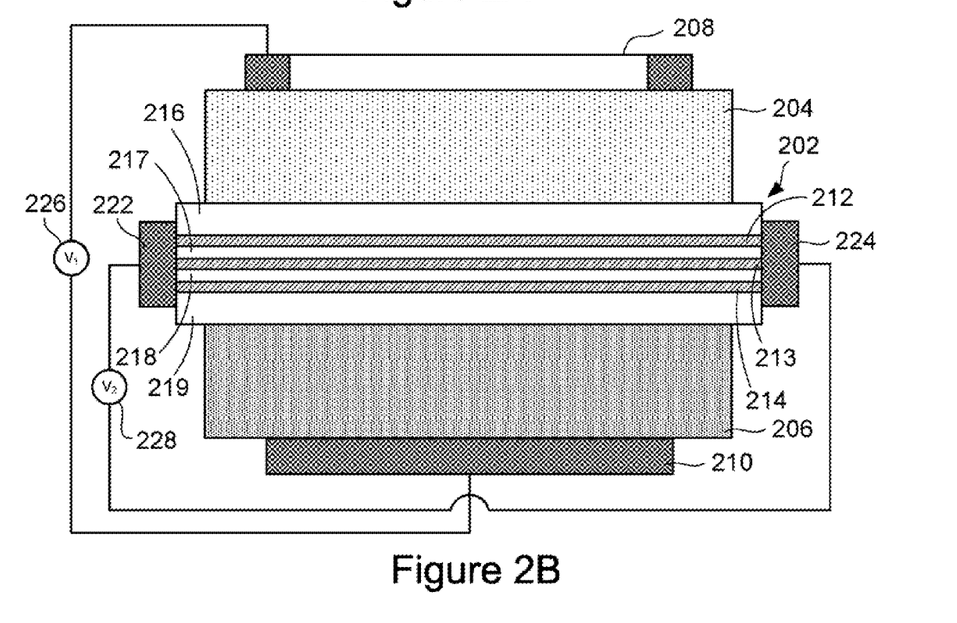
FIG. 2B shows a cross-sectional view of the first light-emitting diode along a line I-I, shown in FIG. 2A, configured in accordance with embodiments of the present invention.

FIG. 2A shows an isometric view of a first LED 200, and FIG. 2B shows a cross-sectional view of the LED 200 along a line I-I shown in FIG. 2A, configured in accordance with embodiments of the present invention. The LED 200 includes a disk-shaped optically active layer 202 sandwiched between a disk-shaped n-type semiconductor layer 204 and a disk-shaped p-type semiconductor layer 206. A first ring-shaped electrode 208 is disposed on the n-type layer 204 and a second electrode 210 (shown in FIG. 2B) is disposed on the p-type layer 206. The optically active layer 202 is composed of three LELs 212-214 and four spacer layers 216-219. In particular, the spacer layers 217-218 separate the LELs 212-214, the spacer layer 216 separates the LEL 212 from the n-type layer 204, and the spacer layer 219 separates the LEL 214 from the p-type layer 206. The LED 200 includes a first external electrode 222 and a second external electrode 224, both of which are disposed on the outer surface of the optically active layer 202 substantially opposite one another and have conductive coupling with the LELs 212-214. Note, in certain embodiments, the LED 200 can be configured so that the electrodes 222 and 224 are not in direct electrical contact with one or more of the spacer layers 216-219.

As shown in FIGS. 2A-2B, the optically active layer 202 extends beyond the n-type layer 204 and the p-type layer 206 to prevent the external electrodes 224 and 226 from contacting the n-type layer 204 and the p-type layer 206, which prevents the LED 200 from shorting out during operation. FIG. 2B also reveals a schematic representation of a first voltage source 226 in electrical communication with the ring electrode 208 and the electrode 210 and a second voltage source 228 in electrical communication with the first external electrode 222 and the second external electrode 224. The first voltage source 226 applies an operating voltage that injects electrons into the n-type layer 204 and into the LELs 212-214. The electrons recombine with holes in the LELs 212-214. When the operating voltage is turned off, an appropriate voltage applied to the external electrodes 222 and 224 by the second voltage source 228 extracts excess carriers from the LELs 212-214 so the electrons do not have an opportunity to recombine with holes, and the light output decreases rapidly during the period when the voltage 226 is low. In other embodiments, the pair of external electrodes 222 and 224 can be replaced with a single extraction electrode where one terminal of the voltage source 228 may be connected to one terminal of the operating voltage 226.

Figure 3A:
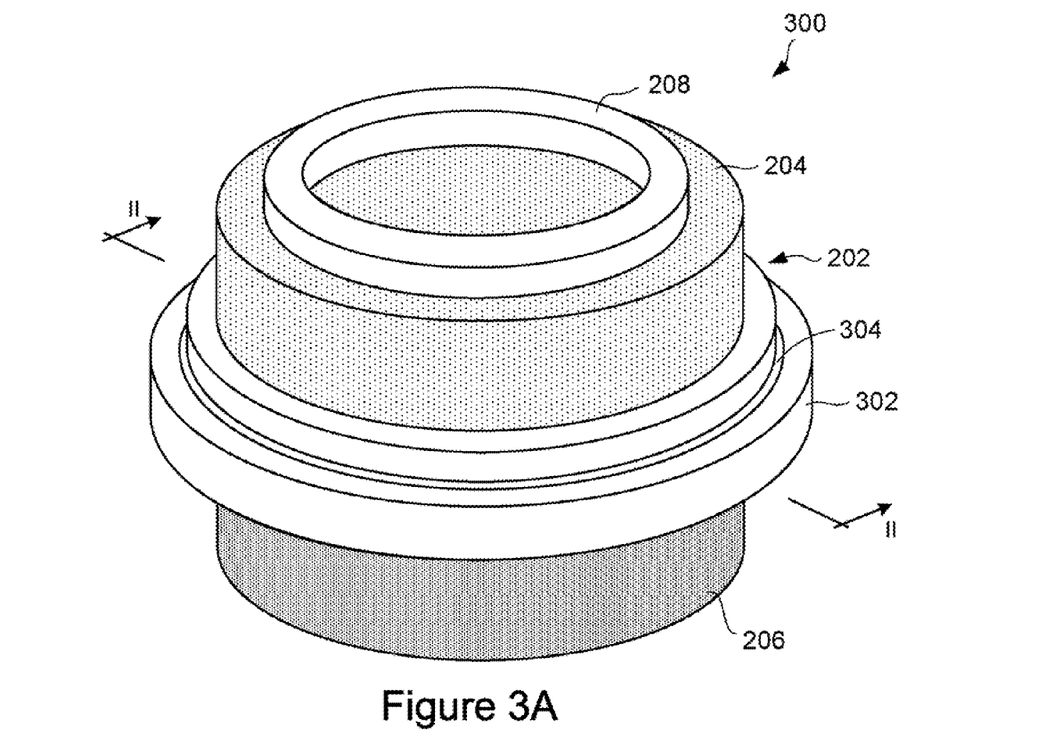
FIG. 3A shows an isometric view of a second light-emitting diode configured in accordance with embodiments of the present invention.
Figure 3B:
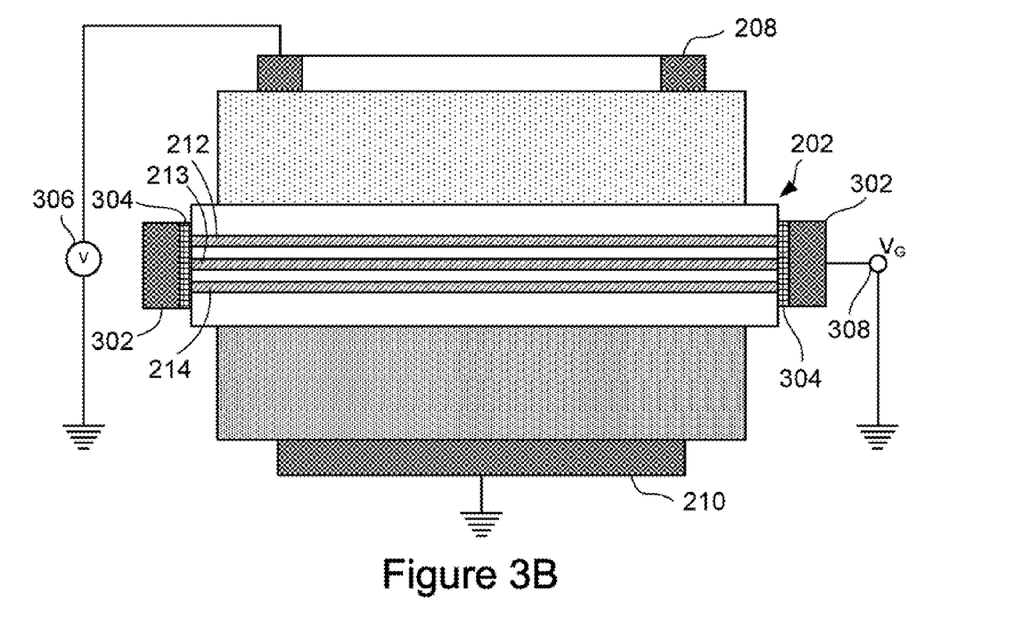
FIG. 3B shows a cross-sectional view of the second light-emitting diode along a line II-II, shown in FIG. 3A, configured in accordance with embodiments of the present invention.

FIG. 3A shows an isometric view of a second LED 300, and FIG. 3B shows a cross-sectional view of the LED 300 along a line II-II, shown in FIG. 3A, configured in accordance with embodiments of the present invention. The LED 300 is substantially identical to the LED 200 except the external electrodes 222 and 224, shown in FIG. 2, have been replaced by a single, external ring-shaped electrode 302 and a thin insulating layer 304 disposed between the external ring electrode 302 and the outer surface of the optically active layer 202. The ring electrode 302 has capacitative coupling with the LELs 212-214. FIG. 3B reveals a schematic representation of a voltage source 306 in electrical communication with the ring electrode 208 and the electrode 210 and a gate voltage source 308 in electrical communication with the external ring electrode 302. The voltage source 306 applies an operating voltage that generates the emission of light from the LELs 214-216. When the operating voltage is turned off, an appropriate voltage applied to the external ring electrode 302 by the gate voltage source 308 extracts excess carriers remaining in the LELs 212-214. Note that in other embodiments, the insulating layer 304 can be excluded and the ring electrode 302 can have conductive coupling with the LELs 212-214.

Note that although the LEDs 200 and 300 are shown in FIGS. 2 and 3 as circular shaped devices, in practice, the LED embodiments of the present invention are not limited to circular configurations and can be configured into many different shapes. For example, LEDs of the present invention can be square, rectangular, elliptical or any other suitable shape.

The layers of the LED 200 form a heterostructure semiconductor that can be composed of various combinations of direct and indirect bandgap semiconductors depending on how the devices are employed. For direct bandgap semiconductors the valence band maximum and the conduction band minimum occur at the same wavenumber. As a result, an electron in the conduction band can recombine with a hole in the valence band giving off the energy difference as a photon of light. In contrast, for indirect semiconductors, the valence band maximum and the conduction band minimum occur at different wavenumbers. As a result, an electron in the conduction band minimum can recombine with a hole in the valence band maximum but must also undergo a momentum change as well as changing its energy. Indirect elemental semiconductors include silicon (Si) and germanium (Ge), and compound semiconductors are typically III-V materials, where Roman numerals III and V represent elements in the IIIa and Va columns of the Periodic Table of the Elements. Compound semiconductors can be composed of column IIIa elements, such as Aluminum (Al), Gallium (Ga), and Indium (In), in combination with column Va elements, such as Nitrogen (N), Phosphorus (P), Arsenic (As), and Antimony (Sb). Compound semiconductors can be classified according to the relative quantities of III and V elements. For example, binary semiconductor compounds include GaAs, InP, InAs, and GaP; ternary compound semiconductors include $GaAs_yP_{1-y}$, where y ranges between 0 and 1; and quaternary compound semiconductors include $In_xGa_{1-x}As_yP_{1-y}$, where both x and y independently range between 0 and 1. Other types of suitable compound semiconductors include II-VI materials, where II and VI represent elements in the IIb and VIa columns of the periodic table. For example, CdSe, ZnSe, ZnS, and ZnO are examples of binary II-VI compound semiconductors. In certain embodiments, the electrodes 208, 210, 222, 224, 302 can be comprised of copper, aluminum, gold, or another suitable electronically conducting metal, or the electrodes 208, 210, 222, 224, 302 can be composed of a heavily doped semiconductor. In other embodiments, the ring electrode 208 can be replaced by a layer of indium tin oxide (ITO) or another suitable conductive, transparent material. The insulating layer 304, shown in FIG. 3, can be composed of aluminum oxide ($Al_2O_3$).

The layers of the LED 200 can be composed of different semiconductor materials so that each layer has a different electronic bandgap energy from that of an adjacent layer within the heterostructure of the LED 200, and each layer can be doped or undoped with different impurities and different impurity concentrations. The impurities can be atoms. For example, boron (B), Al, and Ga are suitable electron acceptor impurities in a column IV material, such as Si, and N, P, and As are suitable electron donor impurities in a column IV material, such as Si.

Figure 4:
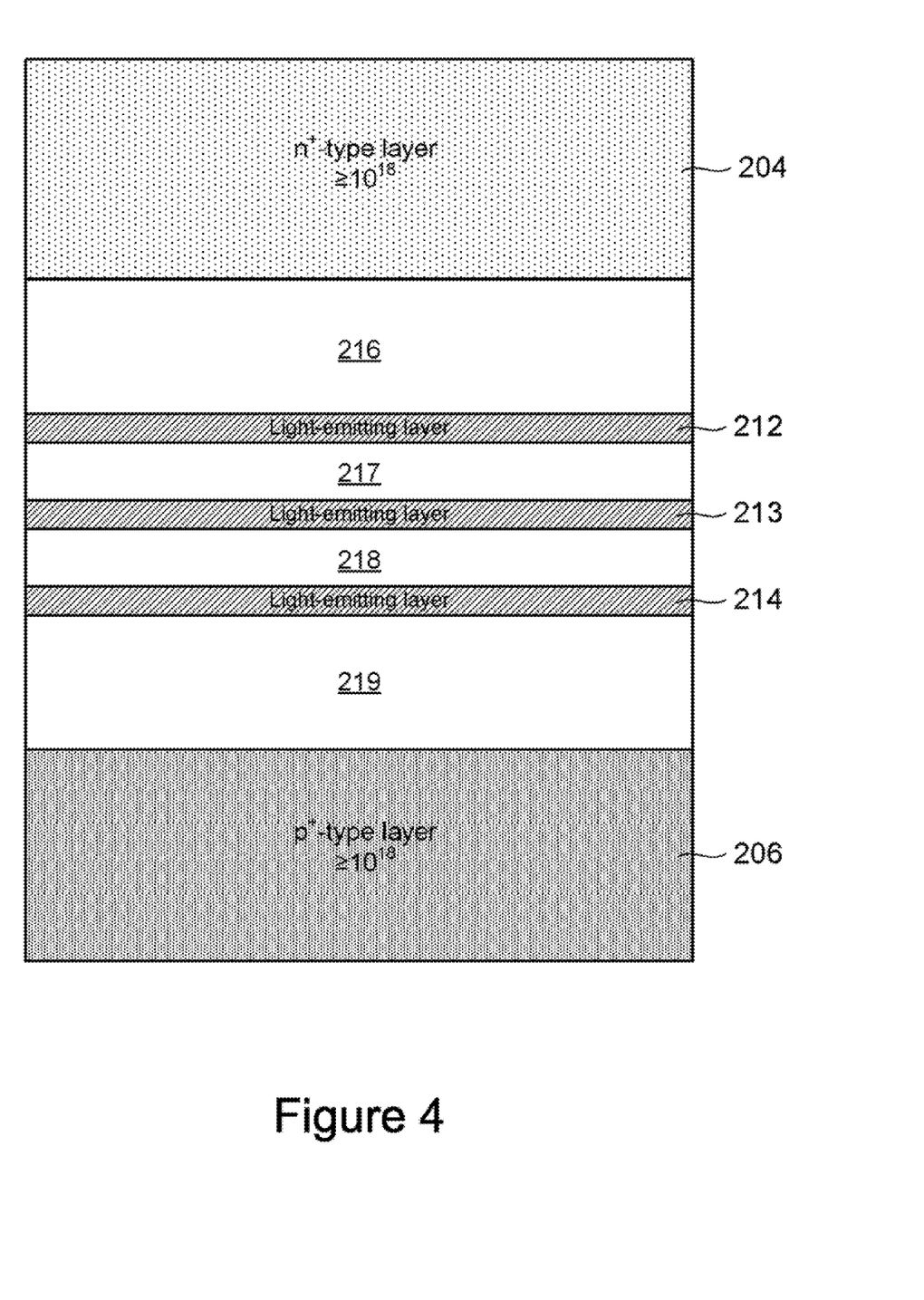
FIG. 4 shows a cross-sectional view of semiconductor layers and corresponding impurity concentrations for a light-emitting diode configured in accordance with embodiment of the present invention.

FIG. 4 shows a cross-sectional view of the semiconductor layers and corresponding impurity concentrations for one embodiment of the present invention. In FIG. 4, the $n^+$-type layer 204 can be heavily doped with an electron donor impurity with a concentration greater than $10^{18}$ impurities/$cm^3$, and the $p^+$-type layer 206 can be heavily doped with an electron acceptor impurity with a concentration greater than $10^{18}$ impurities/$cm^3$. The LELs 212-214 and the spacer layers 216-219 can be composed of intrinsic or undoped direct bandgap semiconductors. For example, in certain embodiments, the LELs 212-214 can be composed of intrinsic InAs and the spacer layers 216-219 can be composed of a compound semiconductor $GaAs_{1-x}N_x$, where x can range from 0 to 1. In other embodiments, the LELs 212-214 can be composed of intrinsic GaAs and the spacer layers 216-219 can be composed of a compound semiconductor $Al_yGa_{1-y}As$, where y ranges from 0 to 1. In other embodiments, the spacer layer 216 can be an n-type semiconductor that has a graded impurity concentration with the highest concentration of electron donor impurities located near the n-type layer 204 and the lowest concentration of impurities located near the LEL 212. Likewise, spacer layer 219 can be a p-type semiconductor that has a graded impurity concentration with the highest concentration of electron acceptor impurities located near the p-type layer 206 and the lowest concentration of impurities located near the LEL 214.

In FIG. 4, in various embodiments, the layer thicknesses are used to indicate that certain layers can be thicker than others but the range of thicknesses can vary widely from one LED embodiment to the next. For example, the thickness of the LELs 212-214 can range from about 5-20 nm, the thickness of the spacer layers 217 and 218 can range from about 5-20 nm, the thickness of the spacers layers 216 and 219 can range from about 5-80 nm, and the thickness of the $n^+$-type layer 204 and the $p^+$-type layer 206 can range from about 100-800 nm or more. In other embodiments, the LELs 212-214 can be fabricated as thin layers on the order of about 5 nm or less. The electronic energy states of these thin-layered LELs 212-214 are quantized and are called "quantum wells."

Figure 5:
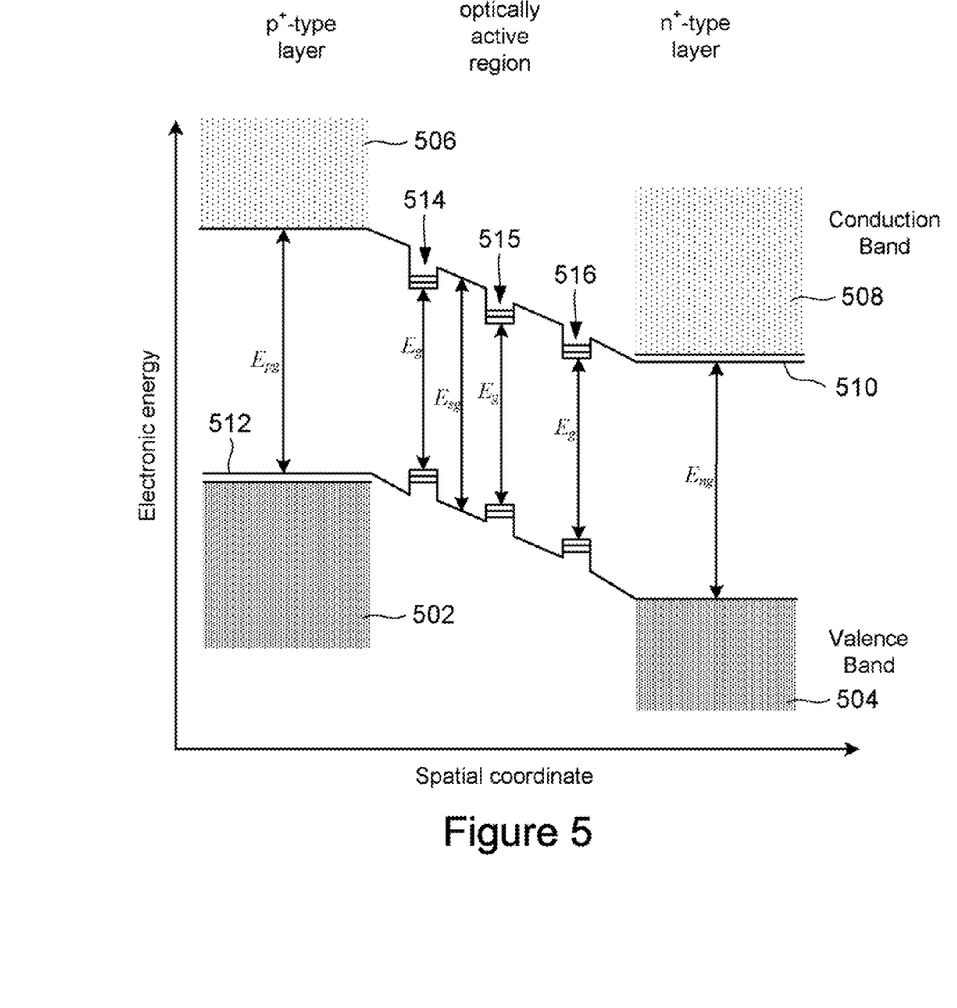
FIG. 5 shows an electronic energy-band diagram associated with the semiconductor layers of the first light-emitting diode, shown in FIG. 2, with no bias applied in accordance with embodiments of the present invention.

The $n^+$-type layer 204, the $p^+$-type layer 206, and the spacer layers 216-219 can be composed of a relatively wide (direct or indirect) electronic bandgap semiconductor materials, while the LELs 212-214 can be composed of semiconductor materials with a relatively narrower electronic bandgap. FIG. 5 shows an electronic energy-band diagram associated with the semiconductor layers of the LED 200 with no bias applied in accordance with embodiments of the present invention. Heavily shaded regions 502 and 504 represent valence bands with a continuum of mostly filled electronic energy states, and lightly shaded regions 506 and 508 represent conduction bands with a continuum of mostly vacant electronic energy states or holes. Electron donor impurities in the heavily doped $n^+$-type layer 204 create electronic states 510 in the forbidden energy gap near the conduction band edge while electron acceptor impurities in the heavily doped $p^+$-type layer 206 create vacant electronic energy states or holes 512 in the forbidden energy gap near the valence band edge, which contribute holes to the valence band. Thus, as shown in FIG. 5, the valence and conduction bands associated with the $p^+$-type layer 206 are higher in electronic energy than the valence and conduction bands associated with the $n^+$-type layer 204. Because of the high concentration of electrons near the conduction band in the $n^+$-type layer 204, electrons can be thermally excited into the conduction band and occupy the lower conduction band electronic energy states 510, and the higher concentration of holes in the $p^+$-type layer 206 occupy the highest valence band electronic energy states 512. At zero bias, the LEDs 212-214 have a relatively low concentration of electrons in the associated conduction bands and a relatively low number of holes in the associated valence bands.

FIG. 5 also reveals that the semiconductor materials selected for the layers of the LED 200 have different associated electronic bandgaps. In particular, the electronic bandgap energy $E_{ng}$ of the $n^+$-type layer 204, the electronic bandgap energy $E_{pg}$ of the $p^+$-type layer 206, and the electronic bandgap energy of the spacer layers 216-219, such as the electronic bandgap energy $E_{sg}$, are all greater than the electronic bandgap energy $E_g$ of the LELs 212-214. As shown in FIG. 5, the electronic energy bands 514-516 include quantized energy levels that are associated with the LELs 212-214 configured as quantum wells.

Figure 6:
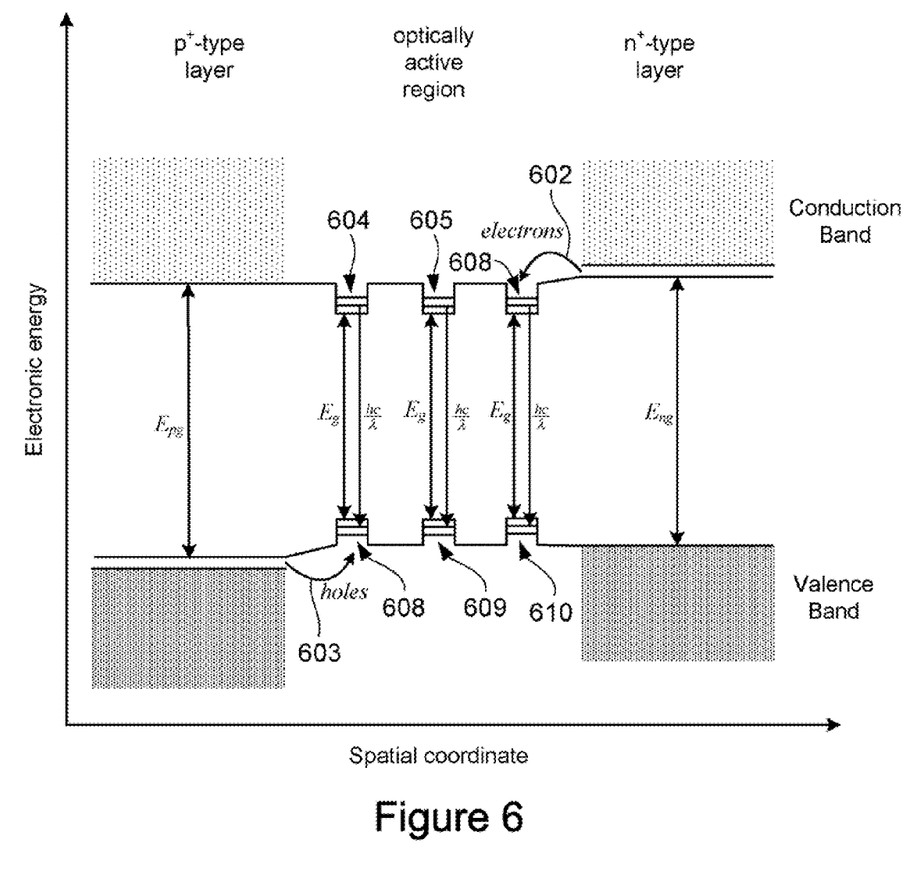
FIG. 6 shows an electronic energy-band diagram associated with the first light-emitting diode, shown in FIG. 2, under an applied forward-bias operating voltage in accordance with embodiments of the present invention.

FIG. 6 shows an electronic energy-band diagram associated with the LED 200 under an applied forward-bias operating voltage in accordance with embodiments of the present invention. Under a forward-bias operating voltage, electrons are injected from the voltage source 226 into the conduction band of the n$^+$-type layer 204, and holes are injected into the valence band of the p$^+$-type layer 206. In contrast to the electronic energy-band diagram shown in FIG. 5, the electronic energy associated with the valence and conduction bands of the p$^+$-type layer 206 are lowered relative to the valence and conduction bands of the n$^+$-type layer 204. The strength of the electric field across the LELs 212-214 is reduced or eliminated and electrons are injected 602 from the conduction band of the n$^+$-type layer 204 into the conduction band electronic energy levels 604-606 of the LELs 212-214, while holes are injected 603 from the valence band of the p$^+$-type layer 206 into the valence band electronic energy levels 608-610 of the LELs 212-214. As a result, there are high densities of electrons in the conduction band energy levels 604-606 and corresponding high densities of holes in the valence band energy levels 608-610 of the LELs 212-214. The relatively higher electronic bandgap energies $E_{ng}$ and $E_{pg}$ of the n$^+$-type layer 204 and the p$^+$-type layer 206 and the spacer layers confine the injected carriers to the respective bands of the LELs 212-214. As long as an appropriate voltage is applied in the same forward-bias direction, high densities of carriers are maintained in the respective bands of the LELs 212-214, and, as shown in FIG. 6, electrons and holes can spontaneously recombine emitting photons with wavelengths $\lambda$ satisfying the condition:

$$E_{ng}, E_{pg}, \text{ and } E_{sg} > \frac{hc}{\lambda} \geq E_g$$

where h is Plank's constant, and c is the speed of light in free space.

In order to reduce the emission of light during the "off" portions of a modulated operating voltage, an extracting voltage is applied to the external electrodes 222 and 224 of the LED 200 or to the external ring electrode 302 of the LED 300. The extracting voltage extracts electrons from the conduction bands and holes from the valence bands of the LELs 212-214. By extracting excess carriers from the respective bands of the LELs 212-214, electrons and holes do not have an opportunity to recombine during the periods when the operating voltage is turned off, and, therefore, the emitted optical signal decreases more rapidly than when no voltage is applied to the external electrodes 222 and 224.

Figure 7:
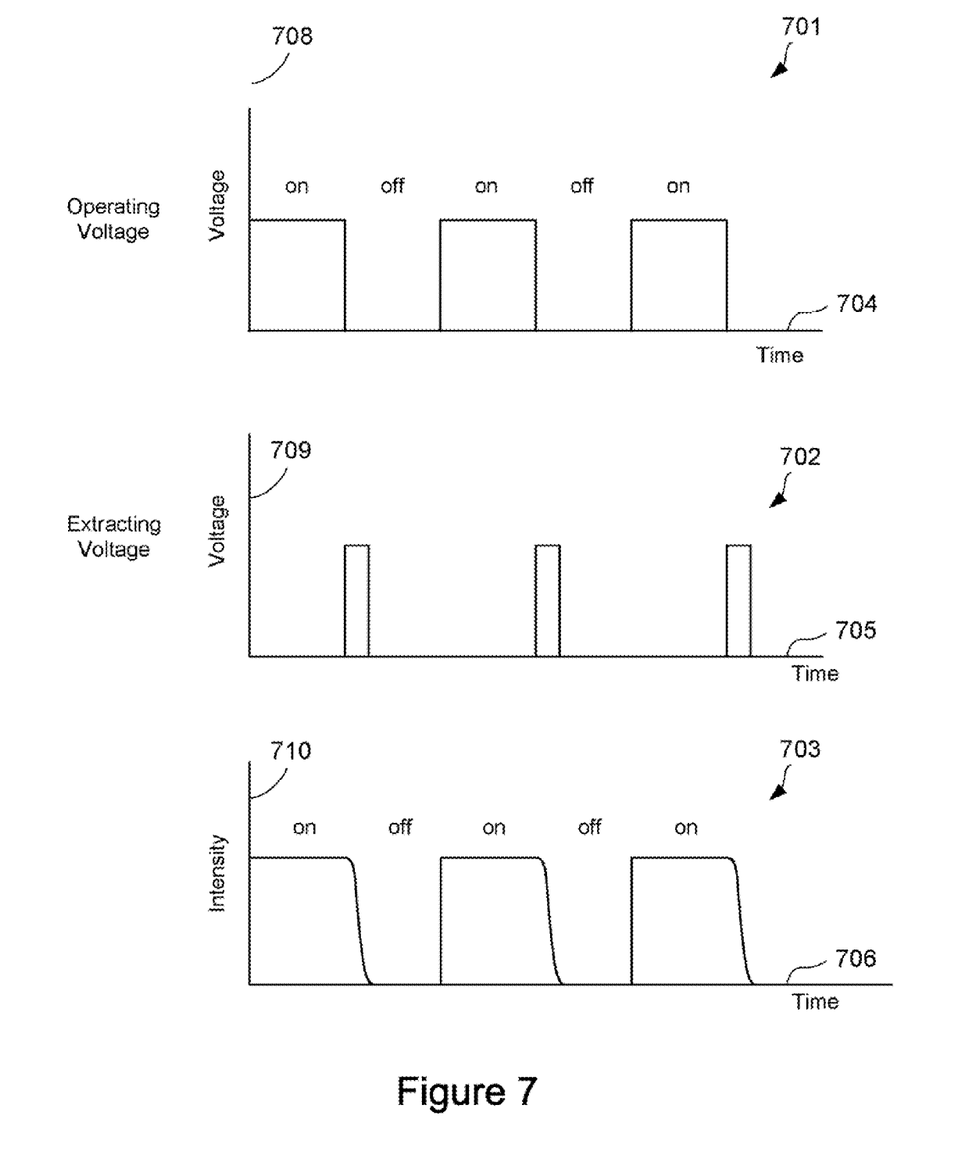
FIG. 7 shows three plots, each plot is associated with operating a light-emitting diode in accordance with embodiments of the present invention.

The following is a general description of operating an LED configured in accordance with the either the LED 200 or the LED 300 using a hypothetical modulated, forward bias, operating voltage and a extracting voltage in accordance with embodiments of the present invention. FIG. 7 shows three plots 701-703, each plot is associated with operating an LED in accordance with embodiments of the present invention. In FIG. 7, horizontal axes 704-706 represent time, vertical axis 708 represents the magnitude of a forward-bias operating voltage applied to an LED, vertical axis 709 represents the magnitude of the extracting voltage applied to the LED, and vertical axis 710 represents emitted optical intensity. The first plot 701 shows "on" and "off" intensities of a modulated, forward-bias operating voltage applied to an LED versus time. The "on" and "off" portions can correspond, for example, to the bits "1" and "0," respectively. The second plot 702 shows extracting voltages applied to the external electrodes of the LED versus time. The third plot 703 shows "on" and "off" intensity portions of a modulated optical signal emitted from the LED versus time. The "on" and "off" portions can also correspond to the bits "1" and "0," respectively. In plots 701 and 703, during the time periods when the operating voltage is turned "on," the LED emits light with substantially constant intensity. On the other hand, the plots 701-703 reveal that at about the times when the operating voltages transition from "on" to "off," the extracting voltages are turned "on." As a result, carriers are no longer being injected into the LELs 212-214 via the operating voltage to undergo recombination. The extracting voltage applied to the external electrodes forces the excess carriers remaining in the conduction and valence bands of the LELs 212-214 out of the conduction and valence bands of the LELs 212-214. As a result, the excess carriers do not have an opportunity to recombine in a radiative process. As shown in plot 703, during the periods when the extracting voltage is turned "on," the intensity of the light emitted rapidly drops off relative to the time before the next operating voltage is applied. Thus, high and low intensity portions of the optical signal shown in plot 703 can be distinguished.

Although the extracting voltages shown in plot 702 appear to be applied for a relative short period of time and then turned "off," embodiments of the present invention are not so limited. In other embodiments, the extraction voltages may not be set to zero between each application. In certain embodiments, the extraction voltage may be open circuited. In other embodiments, the extraction voltage may be set to a predetermined non-zero value. In other embodiments, the extraction voltage may be a flat-band voltage that produces zero net charge near the edges of the optically active layer or it may be a voltage that causes depletion near the edges of the optically active layer. In still other embodiments, application of the operating voltage and the extracting voltage can overlap in time or be separated in time to control the shape of intensity portions of the optical signal.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A light-emitting diode comprising:
    an optically active layer having a first surface, a second surface opposite the first surface, and at least one light-emitting layer embedded within the optically active layer;
    an n-type layer disposed on the first surface of the optically active layer;
    a p-type layer disposed on the second surface of the optically active layer;
    a first electrode disposed on a portion of the n-type layer;
    a second electrode disposed on a portion of the p-type layer; and at least one external electrode electronically coupled to the light-emitting layers.

2. The light-emitting diode of claim 1 wherein the optically active layer further comprises:
a first semiconductor spacer layer sandwiched between the n-type layer and one of the at least one light-emitting layer; and
a second semiconductor spacer layer sandwiched between the p-type layer and one of the at least one light-emitting layer.

3. The light-emitting diode of claim 2 wherein the first semiconductor spacer layer further comprises an n-type semiconductor layer, and the second semiconductor spacer layer further comprises a p-type semiconductor layer.

4. The light-emitting diode of claim 1 wherein the at least one light-emitting layer further comprises at least two light-emitting layers and a spacer layer sandwiched between every two light-emitting layers.

5. The light-emitting diode of claim 1 wherein the first electrode or the second electrode further comprises a ring electrode.

6. The light-emitting diode of claim 1 wherein the first electrode and the second electrode further comprises indium tin oxide.

7. The light-emitting diode of claim 1 wherein the n-type layer further comprises a semiconductor having electron acceptor impurity concentrations greater than about $10^{18}$ impurities/cm$^3$.

8. The light-emitting diode of claim 1 wherein the p-type layer further comprises a semiconductor having electron donor impurity concentrations greater than about $10^{18}$ impurities/cm$^3$.

9. The light-emitting diode of claim 1 wherein the at least one light-emitting layer further comprise intrinsic semiconductor material.

10. The light-emitting diode of claim 1 wherein the at least one light-emitting layer further comprises at least one quantum well.

11. The light-emitting diode of claim 1 further comprises:
a first voltage source in electrical communication with the first electrode and the second electrode, wherein the first voltage source applies a forward-bias operating voltage that caused the emission of light from the light-emitting diode for a first period of time; and
a second voltage source in electrical communication with the at least one external electrode, wherein the second voltage source applies an appropriate extracting voltage that extracts excess carriers from respective bands associated with the at least one light-emitting layer for a second period of time.

12. The light-emitting diode of claim 1 wherein the at least one external electrode electronically coupled to the at least one light-emitting layer further comprises:
an insulating layer disposed on at least a portion of the optically active layer; and
one or more electrodes disposed on the insulating layer and having capacitive coupling with the at least one light-emitting layer.

13. The light-emitting diode of claim 1 wherein the at least one external electrode electronically coupled to the at least one light-emitting layer further comprises a single electrode disposed on at least a portion of the optically active layer and having conductive coupling with the at least one light-emitting layer.

14. The light-emitting diode of claim 1 wherein the at least one external electrode electronically coupled to the at least one light-emitting layer further comprises two electrodes, each electrode disposed on at least a portion of the optically active layer substantially opposite one another and having conductive coupling with the at least one light-emitting layer.

15. A method for generating modulated light from a light-emitting diode, the method comprising:
providing a light-emitting diode configured with an optically active layer sandwiched between an n-type layer and a p-type layer and having a first electrode disposed on the n-type layer, a second electrode disposed on the p-type layer, and have at least one external electrode disposed on at least a portion of the optically active layer;
applying an operating voltage to the first and second electrode for a first period of time, wherein the operating voltage causes emission of light from the optically active layer;
applying a extracting voltage to the at least one external electrode for a second period of time that begins near the time the first period of time ends, wherein the extracting voltage forces excess carriers out of respective conduction and valence bands associated with the optically active layer; and
repeatedly applying the operating voltage followed by applying the extracting voltage to generate modulated light.

16. The method of claim 15 wherein the optically active layer further comprises:
a first semiconductor spacer layer sandwiched between the n-type layer and one of the at least one light-emitting layers; and
a second semiconductor spacer layer sandwiched between the p-type layer and one of the at least one light-emitting layers.

17. The method of claim 16 wherein the first semiconductor spacer layer further comprises an n-type semiconductor layer, and the second semiconductor spacer layer further comprises a p-type semiconductor layer.

18. The method of claim 15 wherein the applying the operating voltage further comprises applying a forward-bias voltage across the n-type layer, the optically active layer, and the p-type layer.

19. The method of claim 15 wherein applying the operating voltage further comprises injecting electrons into the conductions bands and holes into the valence bands of at least one light-emitting layer in the optical active layer.

20. The method of claim 15 wherein applying the extracting voltage to the at least one external electrode further comprises extracting excess carriers from at least one light-emitting layer of the optically active layer before the electrons and holes undergo recombination.

* * * * *

UNITED STATES PATENT AND TRADEMARK OFFICE
CERTIFICATE OF CORRECTION

PATENT NO. : 8,053,982 B2
APPLICATION NO. : 12/243117
DATED : November 8, 2011
INVENTOR(S) : Alexandre Bratkovski et al.

Page 1 of 1

It is certified that error appears in the above-identified patent and that said Letters Patent is hereby corrected as shown below:

In column 10, line 46, in Claim 18, after "wherein" delete "the".

Signed and Sealed this
Thirty-first Day of July, 2012

David J. Kappos
*Director of the United States Patent and Trademark Office*